United States Patent [19]

Nakayama et al.

[11] 4,160,928
[45] Jul. 10, 1979

[54] CASE ASSEMBLY FOR PIEZOELECTRIC RESONATOR

[75] Inventors: Toshihiko Nakayama; Kenji Takei, both of Tokorozawa, Japan

[73] Assignee: Citizen Watch Company Limited, Tokyo, Japan

[21] Appl. No.: 846,140

[22] Filed: Oct. 27, 1977

Related U.S. Application Data

[63] Continuation of Ser. No. 685,257, May 11, 1976, which is a continuation of Ser. No. 523,924, Nov. 14, 1974, abandoned.

[30] Foreign Application Priority Data

Nov. 20, 1973 [JP] Japan .............................. 48-130515

[51] Int. Cl.² ............................................. H01L 41/10
[52] U.S. Cl. ................................................. 310/353
[58] Field of Search ............................... 310/353, 348

[56] References Cited

U.S. PATENT DOCUMENTS

| | | | |
|---|---|---|---|
| 2,820,911 | 1/1958 | Klingsporn | 310/353 X |
| 2,850,651 | 9/1958 | Hoffman | 310/353 |
| 3,931,388 | 1/1976 | Hafner et al. | 310/353 X |
| 3,970,880 | 7/1976 | Deutschmann | 310/353 X |
| 3,988,621 | 10/1976 | Nakayama et al. | 310/348 |

Primary Examiner—Mark O. Budd
Attorney, Agent, or Firm—Fleit & Jacobson

[57] ABSTRACT

An oscillator case assembly includes a casing element and an oscillator element housed therein in a hermetically sealed manner. The casing element is made of a solid insulating material, preferably glass or ceramic material, and at least two thin conductive layer elements are provided on said casing element, each serving as parts of lead-in and lead-out means for the oscillator element, respectively.

6 Claims, 6 Drawing Figures

CASE ASSEMBLY FOR PIEZOELECTRIC RESONATOR

This is a continuation of application Ser. No. 685,257, filed May 11, 1976, which is a continuation of Ser. No. 523,924, filed Nov. 14, 1974, now abandoned.

BACKGROUND OF THE INVENTION

This invention relates to improvements in and relating to an oscillator case assembly for housing an oscillator element comprising a quartz crystal or ceramic body oscillable piezoelectrically or magnetostrictively for generating a series of electrical impulses with a precise frequency.

SUMMARY OF THE INVENTION

An object of the present invention is to provide an improved oscillator case which is miniaturized as possible to avoid idle spaces and highly resistant to outside mechanical shock and vibration, without sacrifice of precisely constant frequency characteristics of the quartz or the like oscillator element housed therein.

A further object is to provide an improved oscillator case of the above kind which is easy to manufacture and to assemble with other operating parts of a watch movement.

These and further objects, features and advantages of the invention will become more apparent when read the following detailed description of the invention to be set forth with reference to the accompanying drawings.

DETAILED DESCRIPTION OF THE INVENTION

In the following, the invention will be described in detail by reference to several embodiments shown and in comparison with a representative mode of the prior art structure.

Figure 1:
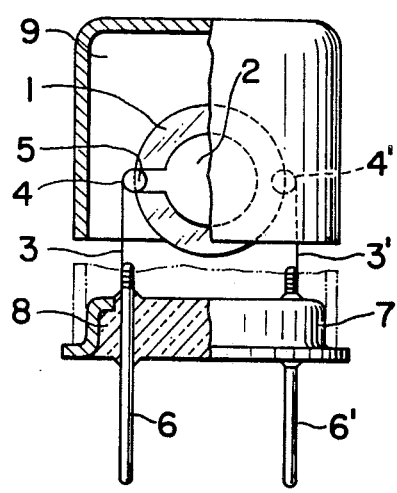
FIG. 1 is a partially sectioned and exploded elevation of an oscillator case according to a representative mode of the known oscillator unit.

Now referring to FIG. 1, illustrative of a representative mode of the comparative and conventional quartz crystal oscillator unit, numeral 1 represents a quartz crystal oscillator element of the thickness shear type, formed into a plano-convex lens which may be, however, modified into a full convex lens, wherein, as shown per se, the oscillation displacement is substantially concentrated at central area of the lens.

Numeral 2 represents a pair of energizing electrodes consisting preferably of precious metal such as gold, silver or the like and fixedly deposited on the opposite surfaces of the lens-shaped element 1 by the vacuum evaporation technique. In FIG. 1 however, only one of said electrodes is visible.

Numerals 3 and 3' represent vertically extending wire leads acting at the same time as the mechanically supporting means for the oscillator element 1, said leads being attached by their upper ends 4; 4' for this purpose to two diametrally opposite points of the periphery of the latter. These upper ends 4 and 4' are formed into respective coiled clips as schematically shown, each of which squeezes the related edge portion of the lens. These clips are fixedly attached to the lens by means of conductive paste shown only schematically for instance, at 5. The lower ends of these wire leads 3 and 3' are fixedly attached to the heads of terminals 6 and 6' which pass fixedly through a glass mass 8 molded in a flanged ring 7.

Numeral 9 represents an inverted tumbler type cover casing element which is fixedly attached to the flanged ring base 7 in hermetically sealed manner, as shown schematically and only partially shown in FIG. 1 in chain-dotted line. This element 9 may be, if necessary, made of glass, although in the drawing, it is shown as being made of a metal. The inside space of the thus assembled unit may be vacuumed or filled with an inert gas, preferably nitrogen, argon or the like. In this manner, the quartz oscillator element is elastically supported and protected well in the sealed-in manner.

The above conventional quartz oscillator unit so far shown and described has been utilized for communication or clock purposes. According to our experience, however, this kind of prior oscillator unit has represented, however, appreciable drawbacks in relation to the necessary resistance to outside mechanical shocks and vibration encountered during use thereof, when it is intended to fit as the time base of an electronic watch movement, in addition to unavoidable space loss. Therefore, an application of such prior art quartz oscillator unit to the watch movement will provide grave hindrance to the modern tendency of overall dimensional reduction, especially that of the thickness of the watch movement.

Next, referring to FIG. 2, the first embodiment of the invention will be described in detail.

Numeral 10 represents a casing element made of a solid insulating material, preferably glass or ceramic material, and shaped into a dish or a bottom-closed shell, having only a small height. This casing element 10 is provided with a pair of thin layer conductive elements 11 and 11' formed by the vacuum evaporation or printing circuit technique and each extending from inside surface through peripheral edge 10a to the outer surface of said casing element 10 and serving as part of lead-in or lead-out means for energizing electrodes 15 which are attached onto the both surfaces of a convex lens type thickness shear oscillator element 14, as at 1 and 2 in the foregoing.

Numerals 12 and 12' represent a pair of members arranged in diametrically opposite arrangement to each other. Each of these members is formed from a rectangular metal strip, having a slight resiliency, into a curved retainer which represents a wavy configuration as a whole as shown. These members 12 and 12' are provided with respective elongate openings 13 and 13' which receive each a portion of the peripheral area of the crystal lens 14 for concentric positioning of the latter within and relative to the casing element 10. When necessary, these members 12 and 12' may be made integral with the latter. One end of these members is directly attached to the inside part of the conductive strip 11 or 11' by soldering or the like fixing and conducting technique. Or alternatively, the strip end may be connected with a wire lead inserted between the both and soldered thereto.

The opposite end of each of these retainers 12 and 12' is soldered to one end of connecting lead 17 or 17' which is connected by its opposite end with the outer end 16 of either of the electrodes 15 by soldering. It will be seen thus from the foregoing that these constituents 11-12-17' or 11'-12'-17 serve as lead-in or lead-out means for the oscillator unit 14; 15. When necessary, an application of conductive paste may be utilized at 16 or 16' in place of the soldering.

Numeral 18 represents a cover disc which may be of the same material with that of the casing element 10, and have the same diameter with the latter, for intimately coupling with the casing element to form a hermetically sealed case assembly by use of a mass of fused glass material of low temperature melting point. The interior space of the thus provided casing is evacuated or charged with an inert protecting gas as before.

Figure 3:
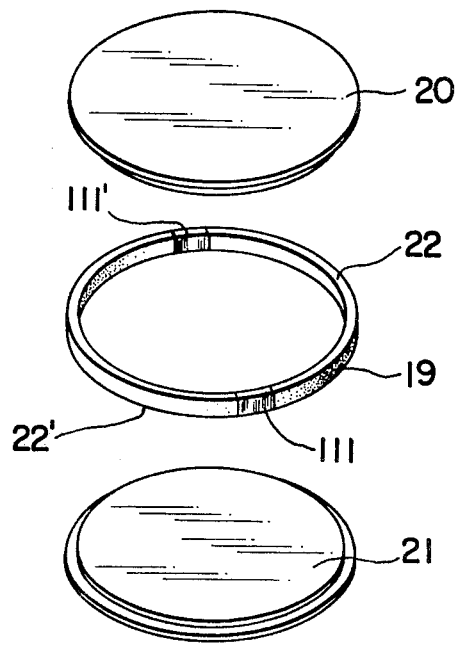
FIG. 3 is an exploded perspective view of several constituent parts of a modification from the first embodiment shown in FIG. 2.

In the modification shown in FIG. 3, the foregoing housing element 10 has been split into two, one being a plain ring member 19 and the other being a flanged bottom member 21 adapted for being hermetically coupled with each other to provide a unified casing member as at 10. Numeral 20 represents a flanged cover disc which may be used similarly as the foregoing plain cover disc 18. In this modification, the ring member 19 is provided with thin layer conductive strips 111 and 111' arranged diametrically opposite to each other in the similar manner as those denoted with 11 and 11', respectively, in the foregoing. Each of these strips extends, however, around four surfaces of the ring 19, including upper and lower end surfaces 22 and 22'.

Figure 2:
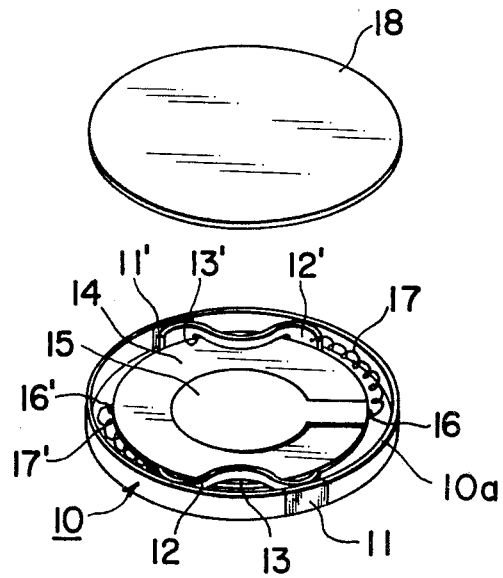
FIG. 2 is an exploded perspective view of a preferred embodiment of the oscillator case according to the present invention and containing a quartz crystal oscillator element.

Other components are same as those of the first embodiment which have been illustrated in FIG. 2 and thus omitted from the drawing only for simplicity.

In the use of the assembly shown in FIG. 2 for drive of an electronic digital time display watch, not shown, current, 6 volts, is supplied from a battery block, not shown, through an integrated circuit block, not shown, and the lead-in passage, say, 11-12-17'-16' to the invisible lower electrode of the quartz oscillator unit shown in FIG. 2, when seen from the negative side of the battery. The output of the oscillating current, say 4 MHz, is taken out from the upper visible electrode 15 through lead-out passage, say, 16-17-12'-11' to the integrated circuit block for driving a liquid crystal cell, not shown, for performing the illuminating digital time display job, as commonly known per se. The return current is led from the integrated circuit block through a conductive base plate, not shown, which is similar to the conventional pillar plate of a mechanical watch movement, to the positive side of said battery. For this purpose, the integrated circuit block comprises an electronic oscillator for the drive of the quartz oscillator; a series of frequency dividers, preferably flip-flops, adapted for reducing the output frequency from the quartz oscillator to, say 1 Hz; electronic counters adapted for the reduced frequencies; decoders for decoding the output signals of said counters into proper signals adapted for corresponding time display representations and a drive circuit for the drive of the liquid crystal display cell, as well known per se.

In the crystal oscillator unit shown in FIG. 2, the quartz crystal element 14 fitted with a pair of energizing electrodes as at 15 is housed in the case 10; 18 and supported rigidly, yet slightly resiliently by means of the pair of supporting and conductive retainers 12 and 12' through optimumly positioning respective openings 13 and 13' so that it may be protected well from outside mechanical shocks and vibrations during practical use of the watch movement having said oscillator unit as a vital working constituent thereof. In addition by the employment of the fine wire leads 17; 17', the connecting points 16 and 16' thereof with the electrodes may consume only a small amount of soldering or conductive paste so that various operational characteristics such as crystal impedance and frequency aging and the like may be improved substantially over the comparative conventional prior art. Further, unemployment of the conventional sealed-in terminal posts, the casing unit may have minimized dimensions and a rather simplified design which fact results in a minimized overall structure of the watch movement with minimized idle spaces formed therein.

Figure 4:
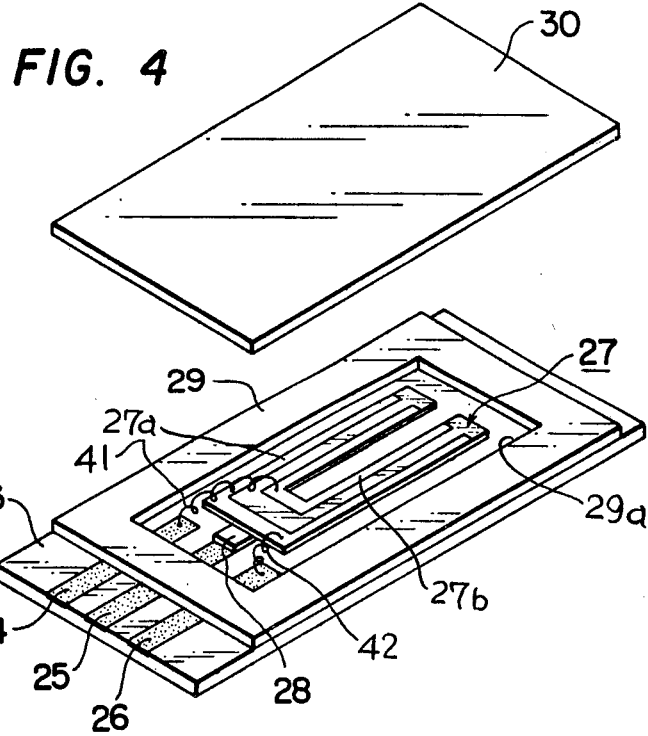
FIG. 4 is an exploded perspective view of a second embodiment of the invention.

In the second embodiment shown in FIG. 4, a base plate 23 has been formed with a solid insulating material, preferably glass or ceramic material. On the upper surface of the base plate 23, there are three parallel thin layer conductive strips 24, 25 and 26 fixed thereon. These strips may be prepared by the printing and etching technique or printing technique alone.

Numeral 27 represents a tuning fork type oscillator made of an insulating material as before and carrying on its upper with an outer thin layer electrode 27a having the shape of a smaller channel in its plan configuration and an inner electrode 27b of the same quality and of a larger channel shape as shown. These electrodes 27a, 27b have been formed in the same manner as before and electrically connected through respective wire leads 41 and 42 with outer conductive strips 24 and 26. The central conductive strip 25 is electrically connected through a conductive supporting member 28 formed into a plate or thick strip which is soldered fixedly to the inner end of the central strip 25. Although not shown, an opposite electrode of the same thin layer mode as that of the visible electrodes 27a; 27b is provided on the rear side of the oscillator 27, said opposite electrode having the same working area as that of the visible both electrodes 27a; 27b in total. The invisible electrode is soldered or rigidly and conductively connected with the conductive support member 28 by conductive paste, for simultaneously and physically supporting the oscillator 27 at its root end. The outer conductive strips 24 and 26 are fed with the drive current with the same polarity at the same time with each other from the drive electronic oscillator circuit, not shown, of an integrated circuit block as before, while the invisible opposite electrode may serve as lead-out means for delivery of a high frequency output signal in the order of 4-30 kHz.

Numeral 29 represents a spacer made equally of an insulating material such as glass or ceramic and formed into a rectangular hollow frame which is fixedly attached to the base plate 23 by means of epoxy resin as an example. The spacer 29 is formed with an opening 29a so as to enclose the oscillator 27 with ample peripheral idle spaces.

A rectangular cover plate 30 is made of the same insulating material as that of the elements 23 and 29 and fixedly and sealingly attached to the spacer by means of epoxy resin or fused glass, so as to provide a perfectly sealed-in working space 29a for the oscillator 27. Although not shown, there is maintained an idle gap, preferably in the order of the thickness of the conductive supporter 28, between the lower surface of the cover plate 30 and the upper surface of the oscillator 27 for allowing undisturbed oscillative movement of the tuning fork type oscillator.

Without further analysis, we believe that any person skilled in the art can understand the operation of the present second embodiment shown in FIG. 4.

Figure 5:
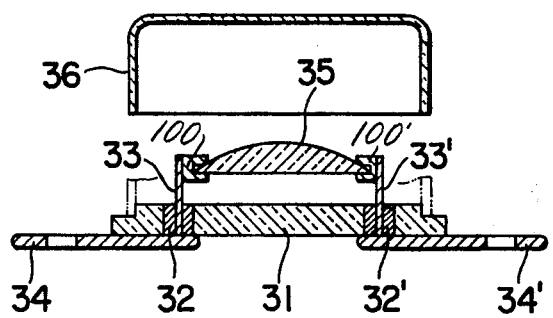
FIG. 5 is a exploded sectional view of a third embodiment of the invention.

In the third embodiment shown in FIG. 5, numeral 31 represents a base plate made of a solid insulating material, preferably glass or ceramic. Rigid plates or posts 33 and 33' pass at their root ends through respective molding masses 32 and 32' of soft metal such as silver, or of low melting glass, so as to establish electrical connection with conductive strips 34 and 34', respectively. Although not shown, there is a fine gap of at least several microns maintained between the bottom surface of the base plate 31 except the molded portions 32 and 32', and the upper surface of the conductive strips 34 or 34'. These strips may be lead-in and lead-out means of the aforementioned sense, respectively, which are connected to the electronic integrated circuit as before, although not shown.

Numeral 35 represents a plano-convex lens type oscillator made of quartz crystal which is rigidly supported at its both sides by means of conductive supporters 100 and 100' which are fixedly attached to the respective upper ends of the supporting members 33 and 33'. Although not shown, a pair of thin layer electrodes as at 15 in FIG. 2 are fixedly attached to the both surfaces of the oscillator 35 and electrically connected with respective supporting members 100 and 100'.

Numeral 36 represents a cover made of the material same as that of the base plate 31 and adapted for being hermetically coupled with the latter by sealing glass or the like as before, as schematically and partially shown in chain-dotted line as before.

The operation of the present third embodiment may be easily understood from the foregoing description thereof in combination with the detailed description of the first embodiment.

The present unit according to the third embodiment can be easily attached to other block, conventional bridge or base plate means of the watch movement, thereby a substantial improvement in the shock-proofness and anti-vibration characteristic of the quartz oscillator being realized without difficulty.

Figure 6:
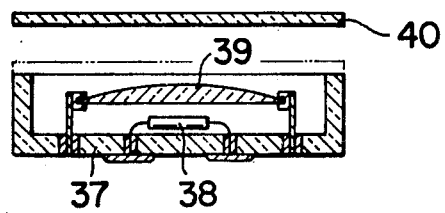
FIG. 6 is a similar view of FIG. 5, illustrative of a fourth embodiment of the invention.

In the fourth embodiment shown in FIG. 6, basic casing member 37 has been shaped into an open box, in place of the plate at 31 employed in the third embodiment.

Numeral 39 represents a quartz oscillator of the similar kind and nature as those of the oscillator 35 in the foregoing. The supporting and conducting means are perfectly same as those denoted 32; 32', 33; 33', 34; 34' and 100; 100' employed in the foregoing third embodiment.

The foregoing cover 36 has been replaced by a cover plate 40, so as to provide a hermetically sealed box casing. Numeral 38 represents an integrated circuit block of the foregoing kind and nature. This block 38 represents representatively a pair of leads which are supported and led in the similar way as the upright conductive supporting members 33 and 33', so far as they are considered with respect to the bottom wall of the basic casing member 37.

It is believed that the operation of the present embodiment will be easily understood by consultation with the detailed description of the foregoing several embodiments.

The embodiments of the invention in which an exclusive property or privilege is claimed are as follows:

1. An oscillator case assembly comprising a thickness shear oscillator element having two surfaces, an energizing electrode attached onto each surface of the oscillator element and fine electrical lead means having members connected electrically at ends of each of said electrodes for energizing said electrodes, said case assembly further comprising a case element shaped into a shell and made of a solid insulating material, preferably glass or ceramic material, a pair of thin layer conductive elements, each extending from an inside surface through a peripheral surface to an outer surface of said case element and serving as part of lead-in or lead-out means for energizing said electrodes, and a pair of conductive retainer members arranged in diametrically opposite arrangement to each other, each retainer member being formed from a rectangular metal strip and having a shaped portion adapted for receiving and supporting a portion of the periphery of said oscillator element, each of said retainer members being electrically connected between one of said members of said lead means and one of said pair of conductive elements.

2. The oscillator case assembly of claim 1, wherein said case element has a bottom-closed shape, and said assembly further comprises a cover for closing the open end of said case element.

3. The oscillator case assembly of claim 1, wherein a top cover and a bottom cover are provided for completely closing said case element on both sides.

4. The oscillator case assembly of claim 1, wherein the portions of said oscillator element supported by said retainer members are spaced from the energizing electrodes attached to said oscillator element.

5. An oscillator case assembly having a case element with support means for supporting a thickness shear oscillator element having a pair of energizing electrodes attached onto opposite surfaces thereof and connecting means adapted for connecting said electrodes to an external power source, wherein the improvement comprises said support means being comprised of a pair of conductive retainer members arranged in diametrically opposite arrangement to each other, each retainer member being formed from a rectangular metal strip and having a shaped portion adapted for receiving and supporting a portion of the periphery of said oscillator element, and said connecting means being comprised of fine electrical lead means having a first member connected between one of said energizing electrodes and one of said retainer members and a second member connected between the other of said energizing electrodes and the other of said retainer members, and a pair of thin layer conductive elements, each extending from an inside surface through a peripheral surface to an outer surface of said case element, a portion of each conductive element on the inside surface of said case element being electrically connected to a respective one of said retainer members.

6. The improvement of claim 5, wherein the portions of said oscillator element supported by said retainer members are spaced from the energizing electrodes attached to said oscillator element.

* * * * *